United States Patent
Kim et al.

(10) Patent No.: US 9,859,317 B2
(45) Date of Patent: Jan. 2, 2018

(54) OPTICAL APPARATUS INCLUDING OPTICAL FUNCTIONAL LAYER HAVING HIGH REFRACTIVE INDEX AND METHOD OF MANUFACTURING THE OPTICAL APPARATUS

(71) Applicant: SAMSUNG ELECTRONICS CO., LTD., Suwon-si (KR)

(72) Inventors: Doyoon Kim, Hwaseong-si (KR); Ilhwan Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/269,417

(22) Filed: Sep. 19, 2016

(65) Prior Publication Data

US 2017/0092668 A1    Mar. 30, 2017

(30) Foreign Application Priority Data

Sep. 24, 2015    (KR) .................. 10-2015-0135545

(51) Int. Cl.
*H04N 9/07* (2006.01)
*H04N 5/225* (2006.01)
(Continued)

(52) U.S. Cl.
CPC ............ *H01L 27/1462* (2013.01); *G02B 1/12* (2013.01); *G02B 27/1006* (2013.01);
(Continued)

(58) Field of Classification Search
CPC ........... H01L 27/1462; H01L 27/14685; H01L 27/14625; H01L 27/1463
(Continued)

(56) References Cited

U.S. PATENT DOCUMENTS 4,415,383 A   11/1983   Naem et al.
5,294,288 A    3/1994   Melpolder et al.
(Continued)

FOREIGN PATENT DOCUMENTS

EP    1 569 014 A1    8/2005
JP    2012-204796 A    10/2012
(Continued)

OTHER PUBLICATIONS

Won, DJ et al., "Effects of thermally induced anatase-to-rutile phase transition in MOCVD-grown TiO2 films on structural and optical properties", Nov. 2001, vol. 73, Issue 5, Applied Physics A (2001) (2 Pages Total), DOI (Digital Object Identifier): 10.1007/S003390100804.

(Continued)

*Primary Examiner* — David Vu
*Assistant Examiner* — Brandon Fox
(74) *Attorney, Agent, or Firm* — Sughrue Mion, PLLC

(57) ABSTRACT

An optical apparatus including an optical functional layer having a high refractive index and a method of manufacturing the optical apparatus are provided. The optical functional layer includes a phase change material that has a first refractive index during heat treatment in a first temperature range and has a second refractive index, which is higher than the first refractive index, during heat treatment in a second temperature range that is higher than the first temperature range. The optical functional layer may be configured to have the second refractive index by using a micro-heater without having to be deposited at a high temperature.

25 Claims, 13 Drawing Sheets

(51) Int. Cl.
| | |
|---|---|
| *H01L 31/062* | (2012.01) |
| *H01L 27/146* | (2006.01) |
| *G02B 1/12* | (2006.01) |
| *G02B 27/10* | (2006.01) |
| *G02B 27/12* | (2006.01) |
| *G02B 5/20* | (2006.01) |

(52) U.S. Cl.
CPC ........ *G02B 27/12* (2013.01); *H01L 27/14621* (2013.01); *H01L 27/14625* (2013.01); *H01L 27/14627* (2013.01); *H01L 27/14645* (2013.01); *H01L 27/14685* (2013.01); *G02B 5/201* (2013.01)

(58) Field of Classification Search
USPC ................................. 257/292; 348/336, 340
See application file for complete search history.

(56) References Cited

U.S. PATENT DOCUMENTS

| | | | | |
|---|---|---|---|---|
| 7,202,896 | B2* | 4/2007 | Wako | G01J 3/18 257/E27.151 |
| 8,384,818 | B2* | 2/2013 | Hiramoto | H01L 27/14621 348/274 |
| 8,541,857 | B2 | 9/2013 | Ahn et al. | |
| 8,865,114 | B2 | 10/2014 | Park et al. | |
| 9,419,036 | B2* | 8/2016 | Saitou | H01L 27/14627 |
| 9,525,006 | B2* | 12/2016 | Nam | G02B 5/201 |
| 9,634,058 | B2 | 4/2017 | Miyashita | |
| 2001/0044175 | A1 | 11/2001 | Barrett et al. | |
| 2003/0044152 | A1 | 3/2003 | Bazylenko | |
| 2010/0019129 | A1* | 1/2010 | Ishigaki | H01L 27/14621 250/208.1 |
| 2010/0035376 | A1 | 2/2010 | Noh et al. | |
| 2010/0187220 | A1 | 7/2010 | Choi et al. | |
| 2012/0212656 | A1 | 8/2012 | Hiramoto et al. | |
| 2013/0099343 | A1* | 4/2013 | Toshikiyo | H01L 27/14625 257/432 |
| 2013/0241018 | A1 | 9/2013 | JangJian et al. | |
| 2015/0098006 | A1 | 4/2015 | Oka | |
| 2015/0318318 | A1 | 11/2015 | Nam et al. | |
| 2016/0109716 | A1* | 4/2016 | Sohn | G02B 27/1013 359/639 |

FOREIGN PATENT DOCUMENTS

| | | |
|---|---|---|
| JP | 2015-76475 A | 4/2015 |
| KR | 10-2010-0019853 A | 2/2010 |
| KR | 10-2010-0086799 A | 8/2010 |
| KR | 10-2010-0130053 A | 12/2010 |
| KR | 10-2011-0003968 A | 1/2011 |
| KR | 10-2011-0091372 A | 8/2011 |
| KR | 10-2014-0105887 A | 9/2014 |

OTHER PUBLICATIONS

Frank W. Mont et al., "High refractive index nanoparticle-loaded encapsulants for light-emitting diodes", SPIE Proceedings, vol. 6486, Light-Emitting Diodes: Research, Manufacturing, and Applications XI, 64861C (Feb. 13, 2007) (2 Pages Total), doi:10.1117/12.723305.

Joseph Lik Hang Chau et al., "Transparent high refractive index nanocomposite thin films", Materials Letters 61 (2007) (pp. 2908-2910).

T. B. Ghosh et al., "On crystallite size dependence of phase stability of nanocrystalline $TiO_2$", Journal of Applied Physics vol. 94, No. 7, Oct. 1, 2003, (pp. 4577-4582, 7 Pages Total).

Masanori Hirano et al., "Photoactivity and phase stability of $ZrO_2$-doped anatase-type $TiO_2$ directly formed as nanometer-sized particles by hydrolysis under hydrothermal conditions", Academic Press, Journal of Solid State Chemistry 170 (2003) (pp. 39-47).

Guangshe Li et al., "High Purity Anatase $TiO_2$ Nanocrystals: Near Room-Temperature Synthesis, Grain Growth Kinetics, and Surface Hydration Chemistry", Journal American Chemical Society. 2005, 127 (pp. 8659-8666).

Teruhisa Ohno et al., "Photocatalytic Activities of Pure Rutile Particles Isolated from $TiO_2$Powder by Dissolving the Anatase Component in HF Solution", J. Phys. Chem. B 2001, 105 (pp. 2417-2420).

Seiji Nishiwaki et al., "Efficient colour splitters for high-pixel-density image sensors", Nature Photonics, vol. 7, Mar. 2013, DOI: 10.1038/NPHOTON.2012.345 (pp. 240-246).

Do-Yoon Kim et al., "Selective Formation of Carbon Nanotubes and Its Application to Field-Emitter Arrays", IEEE Electron Device Letters, vol. 30, No. 7, July 2009 (pp. 709-711).

Communication dated Feb. 3, 2017, issued by the European Patent Office in counterpart European application No. 16189530.5.

Hubert Selhofer, et al., "Properties of titanium dioxide films prepared by reactive electron-beam evaporation from various starling materials", Applied Optics, vol. 41, No. 4, Optical Society of America, Feb. 1, 2002, pp. 756-762.

Communication dated Jun. 16, 2017, issued by the European Patent Office in counterpart European application No. 16189530.5.

Communication dated Jul. 24, 2017, issued by the European Patent Office in counterpart European application No. 16189530.5.

* cited by examiner

OPTICAL APPARATUS INCLUDING OPTICAL FUNCTIONAL LAYER HAVING HIGH REFRACTIVE INDEX AND METHOD OF MANUFACTURING THE OPTICAL APPARATUS

CROSS-REFERENCE TO RELATED APPLICATION

This application claims priority from Korean Patent Application No. 10-2015-0135545, filed on Sep. 24, 2015 in the Korean Intellectual Property Office, the disclosure of which is incorporated herein by reference in its entirety.

BACKGROUND

1. Field

Apparatuses and methods consistent with exemplary embodiments relate to optical apparatuses including layers having high refractive indices and methods of manufacturing the optical apparatuses, and more particularly, to an optical apparatus, such as an image sensor, a light-emitting diode (LED), or an organic light-emitting diode (OLED), including an optical functional layer having a high refractive index and a method of manufacturing the optical apparatus.

2. Description of the Related Art

Color display devices or color image sensors usually display an image of various colors or detect a color of incident light by using a color filter. An RGB color filter method, in which, for example, a green filter is arranged at two pixels from among four pixels and a blue filter and a red filter are arranged in the other two pixels, is widely employed by currently used color display devices or color image sensors. In addition to the RGB color filter method, a CYGM color filter method may be employed in which color filters of cyan, yellow, green, and magenta, which are complementary colors, are respectively arranged at four pixels.

However, a color filter may have low light use efficiency because the color filter absorbs light of colors other than a color corresponding to the color filter. For example, when an RGB color filter is in use, only ⅓ of the incident light is transmitted and the other portion, that is, ⅔, of the incident light is absorbed. Accordingly, the light use efficiency may be about 33%. Accordingly, for a color display device or color image sensor, most light loss occurs in the color filter.

Recently, to improve the light use efficiency of color display devices or color image sensors, a color separation layer is used instead of the color filter. The color separation layer may separate the color of an incident light by using the diffraction or refraction characteristics of light that vary according to a wavelength of the light. The colors separated by the color separation layer may be respectively provided to pixels of an image sensor, which correspond to the colors. It is known that color separation characteristics are improved as a refractive index of the color separation layer increases.

SUMMARY

One or more exemplary embodiments provide optical apparatuses, such as image sensors, light-emitting diodes, or organic light-emitting diodes, including optical functional layers having high refractive indices.

Further, one or more exemplary embodiments provide methods of manufacturing the optical apparatuses.

According to an aspect of an exemplary embodiment, there is provided an optical apparatus including: a semiconductor layer; and an optical functional layer including a phase change material that has a first refractive index during heat treatment in a first temperature range and has a second refractive index, which is higher than the first refractive index, during heat treatment in a second temperature range that is higher than the first temperature range, wherein the phase change material of the optical functional layer having the second refractive index may be disposed on the semiconductor layer.

For example, the phase change material may include $TiO_2$ or SiN.

For example, the first temperature range may be from about 400° C. to about 550° C. and the second temperature range may be from about 600° C. to about 900° C.

Also, for example, the first refractive index may range from about 2.4 to about 2.6 and the second refractive index may range from about 2.7 to about 2.9.

The optical apparatus may be an image sensor, and the semiconductor layer may include a pixel array of a plurality of pixels that detects an intensity of incident light.

The optical functional layer may include a plurality of color separation elements. Each of the plurality of color separation elements may split the incident light according to wavelengths such that light having a first wavelength among the incident light is emitted in a first direction and light having a second wavelength, which is different from the first wavelength, among the incident light is emitted in a second direction that is different from the first direction.

The pixel array may include a plurality of first pixels provided to detect the light having the first wavelength and a plurality of second pixels provided to detect the light having the second wavelength that is different from the first wavelength, wherein the plurality of first pixels and the plurality of second pixels are alternately arranged.

The plurality of color separation elements may be configured such that the light having the first wavelength among the incident light travels to the plurality of first pixels and the light having the second wavelength among the incident light travels to the plurality of second pixels.

The optical functional layer may include a plurality of microlenses configured to focus the incident light on the plurality of pixels.

According to an aspect of another exemplary embodiment, there is provided an image sensor including: a pixel array including a plurality of light-sensing pixels provided to detect an intensity of incident light; and a plurality of color separation elements facing the pixel array and configured to split the incident light into a plurality of sub-lights according to wavelengths and enable the plurality of sub-lights to travel in different directions, wherein the plurality of color separation elements include a phase change material that has a first refractive index during heat treatment in a first temperature range and has a second refractive index, which is higher than the first refractive index, during heat treatment in a second temperature range that is higher than the first temperature range, wherein the plurality of color separation elements may have the second refractive index.

The pixel array may include a plurality of first pixels provided to detect light having a first wavelength and a plurality of second pixels provided to detect light having a second wavelength that is different from the first wavelength, wherein the plurality of first pixels and the plurality of second pixels are alternately arranged.

Each of the plurality of color separation elements may be configured such that light having a first wavelength among the incident light travels to a first pixel and light having a second wavelength among the incident light travels to a second pixel.

The pixel array may include a first pixel and a third pixel arranged in a first diagonal direction and two second pixels arranged in a second diagonal direction that intersects the first diagonal direction, and may be configured such that the first pixel detects light having a first wavelength, the two second pixels detect light having a second wavelength, and the third pixel detects light having a third wavelength.

The plurality of color separation elements may include a first color separation element arranged in the first diagonal direction and a second color separation element arranged in the second diagonal direction, wherein the first and second color separation elements are configured such that the light having the first wavelength among the incident light travels to the first pixel and the light having the second and third wavelength among the incident light travels to the third pixel.

The image sensor may further include a color filter layer disposed on the pixel array, wherein the color filter layer includes a first color filter configured to transmit light having a first wavelength, a second color filter configured to transmit light having a second wavelength, and a third color filter configured to transmit light having a third wavelength.

The image sensor may further include a transparent dielectric layer disposed on the color filter layer, and the color separation elements may be buried in the plurality of transparent dielectric layer.

According to an aspect of another exemplary embodiment, there is provided a method of manufacturing an optical apparatus including: depositing an optical functional layer material in a first temperature range; forming a micro-heater on the optical functional layer material; locally heat-treating the optical functional layer material in a second temperature range, which is higher than the first temperature range, by applying current to the micro-heater; and removing the micro-heater, wherein the optical functional layer material includes a phase change material that has a first refractive index during heat treatment in the first temperature range and has a second refractive index, which is higher than the first refractive index, during heat treatment in the second temperature range that is higher than the first temperature range.

Also, the forming of the micro-heater may include: forming an insulating layer on the optical functional layer material; forming a conductive metal layer material on the insulating layer; and forming a conductive metal layer by patterning the conductive metal layer material by using wet etching, wherein a portion of the insulating layer that is disposed under the conductive metal layer is removed during the patterning of the conductive metal layer material to expose the optical functional layer material to the patterned conductive metal layer.

The patterned conductive metal layer may include a pad portion configured to receive current, a first heating portion configured to generate heat at a temperature lower than or equal to the first temperature range, and a second heating portion configured to generate heat in the second temperature range, wherein a width of the second heating portion is less than a width of the first heating portion.

A portion of the insulating layer that is disposed under the pad portion or the first heating portion of the patterned conductive metal layer may remain without being removed.

The depositing of the optical functional layer material may further include patterning the deposited optical functional layer material to form an optical functional layer.

The local heat-treating of the optical functional layer material may further include removing portions of the optical functional layer material other than a portion of the optical functional layer material that is heat-treated in the second temperature range, to form an optical functional layer.

BRIEF DESCRIPTION OF THE DRAWINGS

The and/or other aspects will be more apparent by describing certain exemplary embodiments, with reference to the accompanying drawings, in which.

DETAILED DESCRIPTION

Figure 1:
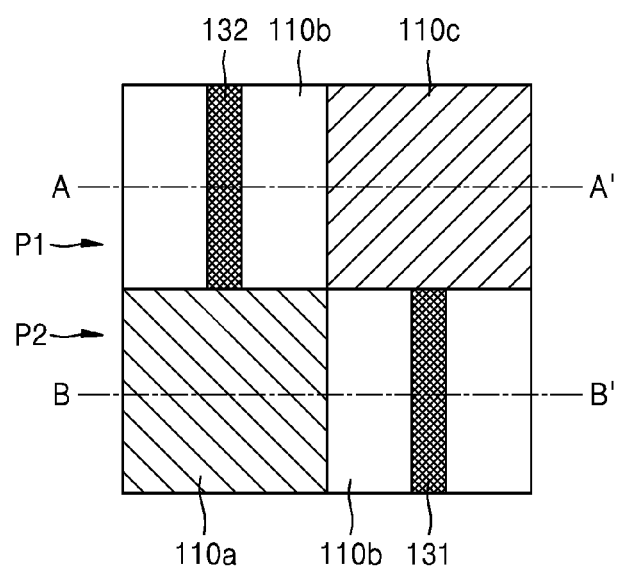
FIG. 1 is a plan view illustrating a pixel structure of an optical apparatus (e.g., an image sensor) according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

In the drawings, the thicknesses of layers and regions and the sizes of components may be exaggerated for clarity. It will be understood that when a layer is referred to as being "on" another layer, it can be directly on the other layer, or intervening layers may also be present therebetween.

FIG. 1 is a plan view illustrating a pixel structure of an optical apparatus, for example, an image sensor, according to an exemplary embodiment. Referring to FIG. 1, the image sensor may have a Bayer pattern including a first pixel 110a and a third pixel 110c arranged in a first diagonal direction and two second pixels 110b arranged in a second diagonal direction that intersects the first diagonal direction. Although one Bayer pattern is shown in FIG. 1 for convenience of explanation, the image sensor may include a pixel array having a plurality of Bayer patterns. For example, the image sensor may include a first pixel row P1 in which a plurality of the second pixels 110b and a plurality of the third pixels 110c are horizontally alternately arranged and a second pixel row P2 in which a plurality of the first pixels 110a and the plurality of second pixels 110b are alternately arranged in a horizontal direction. A plurality of the first pixel rows P1 and a plurality of the second pixel rows P2 may be alternately arranged in a vertical direction.

Also, the image sensor may include a first optical functional layer 131 disposed to face the second pixel 110b in the second pixel row P2 and a second optical functional layer 132 disposed to face the second pixel 110b in the first pixel row P1. The first and second optical functional layers 131 and 132 split incident light into parts according to wavelengths and enable the parts having different wavelengths to travel in different paths. The first and second optical functional layers 131 and 132 may perform color separation by changing travel paths of incident light according to wavelengths of the incident light by using diffraction or refraction characteristics that vary according to wavelengths. Accordingly, the first and second optical functional layers 131 and 132 may be referred to as color separation elements. For example, color separation elements may have any of various shapes such as a transparent symmetric bar shape, a transparent asymmetric bar shape, or a prism shape having an inclined surface, and may be designed in various ways according to a desired spectrum distribution of emitted light.

The first optical functional layer 131 may be configured such that light having a first wavelength band among incident light obliquely travels leftward and rightward and light having a second wavelength band among the incident light travels downward from the first optical functional layer 131. The light having the first wavelength band split by the first optical functional layer 131 may be incident on the first pixel 110a adjacent to the second pixel 110b in the second pixel row P2, and the light having the second wavelength band may be incident on the second pixel 110b facing the first optical functional layer 131 in the second pixel row P2. Also, the second optical functional layer 132 may be configured such that light having a third wavelength band among incident light obliquely travels leftward and rightward and light having the second wavelength band travels downward from the second optical functional layer 132. Accordingly, the light having the third wavelength band split by the second optical functional layer 132 may be incident on the third pixel 110c adjacent to the second pixel 110b in the first pixel row P1 and the light having the second wavelength band may be incident on the second pixel 110b facing the second optical functional layer 132 in the first pixel row P1.

Figure 2A:
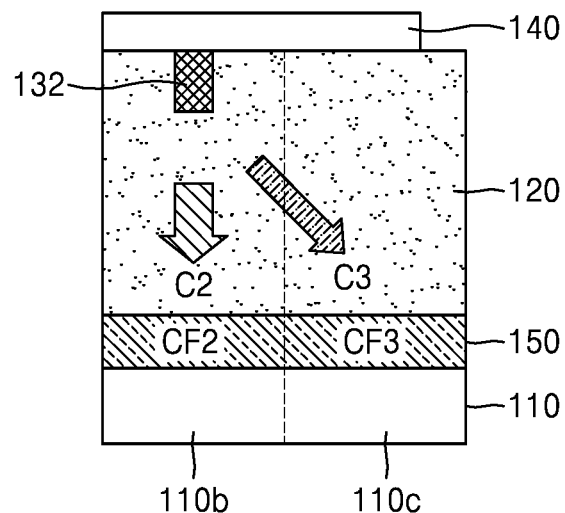
FIG. 2A is a cross-sectional view taken along a line A-A' of the image sensor of FIG. 1.

FIG. 2A is a cross-sectional view taken along line A-A' of the first pixel row P1 in the image sensor of FIG. 1. Referring to FIG. 2A, the first pixel row P1 of the image sensor may include a light-sensing semiconductor layer 110 configured to convert an intensity of incident light into an electrical signal, a color filter layer 150 disposed on the light-sensing semiconductor layer 110 and configured to transmit only light having a desired wavelength band, a transparent dielectric layer 120 disposed on the color filter layer 150, the second optical functional layer 132 fixedly buried in the transparent dielectric layer 120, and a microlens 140 disposed on the transparent dielectric layer 120. The light-sensing semiconductor layer 110 may include, for example, a semiconductor circuit including a light-sensing device and a switching device. The second pixel 110b and the third pixel 110c may be arranged in the light-sensing semiconductor layer 110 of the first pixel row P1. The color filter layer 150 may include a second color filter CF2 disposed on the second pixel 110b and configured to transmit only light C2 having a second wavelength band and a third color filter CF3 disposed on the third pixel 110c and configured to transmit only light C3 having a third wavelength band. The second optical functional layer 132 may be disposed to face the second pixel 110b.

As shown in FIG. 2A, among light incident on the second optical functional layer 132, the light C2 having the second wavelength band may pass through the second color filter CF2 disposed under the second optical functional layer 132 and may be incident on the second pixel 110b. Also, the light C3 having the third wavelength band may obliquely travel to both sides of the second optical functional layer 132, and then may pass through the third color filter CF3 and may be incident on the third pixel 110c. Even when the second and third color filters CF2 and CF3 are used, since the lights C2 and C3 that are split to some extent by the second optical functional layer 132 are respectively incident on the second and third color filters CF2 and CF3, light loss due to the color filter layer 150 is not great. When color separation performed by the second optical functional layer 132 is sufficient, the color filter layer 150 may be omitted.

Figure 2B:
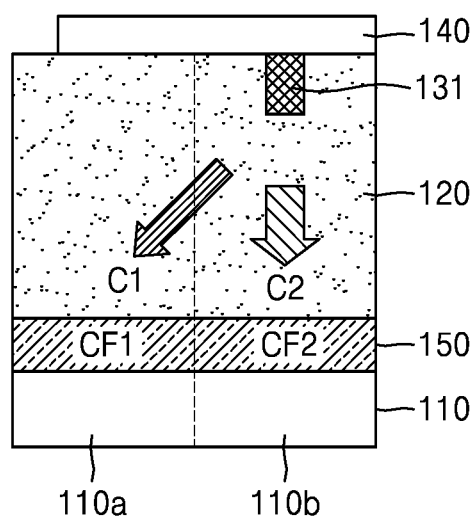
FIG. 2B is a cross-sectional view taken along a line B-B' of the image sensor of FIG. 1.

FIG. 2B is a cross-sectional view taken along line B-B' of the second pixel row P2 in the image sensor of FIG. 1. Referring to FIG. 2B, the second pixel row P2 of the image sensor may include the light-sensing semiconductor layer 110 configured to convert an intensity of incident light into an electrical signal, the color filter layer 150 disposed on the light-sensing semiconductor layer 110 and configured to transmit only light having a desired wavelength band, the transparent dielectric layer 120 disposed on the color filter layer 150, the first optical functional layer 131 fixedly buried in the transparent dielectric layer 120, and the microlens 140 disposed on the transparent dielectric layer 120. The first pixel 110a and the second pixel 110b may be arranged in the light-sensing semiconductor layer 110 of the second pixel row P2. The color filter layer 150 may include the first color filter CF1 disposed on the first pixel 110a and configured to transmit only a light C1 having a first wavelength band and the second color filter CF2 disposed on the second pixel 110b and configured to transmit only the light C2 having the second wavelength band. The first optical functional layer 131 may be disposed to face the second pixel 110b.

As shown in FIG. 2B, among light incident on the first optical functional layer 131, the light C2 having the second wavelength band may pass through the second color filter CF2 disposed under the first optical functional layer 131 and may be incident on the second pixel 110b. Also, the light C1 having the first wavelength band may obliquely travel to both sides of the first optical functional layer 131, and then may pass through the first color filter CF1 and may be incident on the first pixel 110a. Even in the second pixel row P2, when color separation performed by the first optical functional layer 131 is sufficient, the color filter layer 150 may be omitted. Alternatively, some of the first through third color filters CF1, CF2, and CF3 may be omitted.

Also, as shown in FIGS. 2A and 2B, in the first pixel row P1, the microlens 140 may extend to the third pixels 110c on both sides of the second pixel 110b. Also, in the second pixel row P2, the microlens 140 may extend to the first pixels 110a on both sides of the second pixel 110b. However, the image sensor does not need to use only the microlens 140 of FIGS. 2A and 2B. For example, the microlens 140 may be disposed on each of the first through third pixels 110a, 110b, and 110c. Alternatively, the microlens 140 may be omitted.

The image sensor according to the present exemplary embodiment may improve light use efficiency and color purity by using the first and second optical functional layers 131 and 132. Furthermore, since a Bayer pattern method adopted by a general image sensor is used, a pixel structure and an image processing algorithm of the general image sensor do not need to be greatly changed. The image sensor according to the present exemplary embodiment may be applied to various imaging apparatuses and may provide high-quality images.

In order to sufficiently diffract and refract incident light, the first and second optical functional layers 131 and 132 may be formed of a material having a refractive index that is higher than a refractive index of an adjacent element. For example, a refractive index of the first and second optical functional layers 131 and 132 may be higher than a refractive index of the transparent dielectric layer 120. For example, the transparent dielectric layer 120 may be formed of $SiO_2$ or silanol-based glass (e.g., siloxane-based spin on glass (SOG)), and the first and second optical functional layers 131 and 132 may be generally formed of a material having a high refractive index such as $TiO_2$, $SiN_3$, ZnS, ZnSe, or $Si_3N_4$. As a difference between a refractive index of the first and second optical functional layers 131 and 132 and a refractive index of the transparent dielectric layer 120 increases, a thickness of the image sensor may decrease and color separation characteristics of the first and second optical functional layers 131 and 132 may be improved.

In general, when physical vapor deposition (PVD) is used at a high temperature higher than or equal to about 600° C., the first and second optical functional layers 131 and 132 having a sufficiently high refractive index may be formed. However, the light-sensing semiconductor layer 110 and the color filter layer 150 disposed under the first and second optical functional layers 131 and 132 may be damaged due to heat at the high temperature. In contrast, when a deposition temperature is reduced in order to reduce the risk of damage to the light-sensing semiconductor layer 110 and the color filter layer 150, a refractive index of the first and second optical functional layers 131 and 132 may not be sufficiently high.

For example, FIGS. 3A through 3I are cross-sectional views for explaining a process of manufacturing the image sensor of FIG. 1 according to an exemplary embodiment. A process of forming the first and second optical functional layers 131 and 132 having a high refractive index without damaging the light-sensing semiconductor layer 110 and the color filter layer 150 will now be explained with reference to FIGS. 3A through 3I.

Figure 3A:
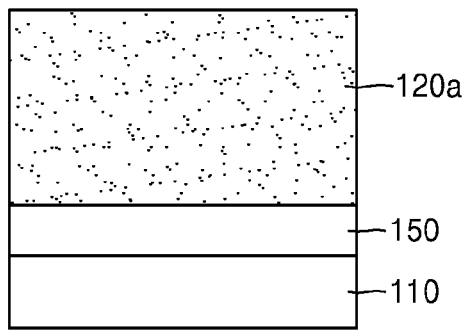
FIGS. 3A, 3B, 3C, 3D, 3E, 3F, 3G, 3H, and 3I are cross-sectional views for explaining a process of manufacturing the image sensor of FIG. 1, according to an exemplary embodiment.

First, referring to FIG. 3A, the color filter layer 150 is formed on the light-sensing semiconductor layer 110 and a first transparent dielectric layer 120a is formed on the color filter layer 150. Although the light-sensing semiconductor layer 110 is simply illustrated as one layer in FIG. 3A, the light-sensing semiconductor layer 110 may include a complex integrated circuit formed by patterning a semiconductor material such as silicon, a compound semiconductor, or an oxide semiconductor and a metal wiring line, and may include an array of pixels. Also, the light-sensing semiconductor layer 110 may be protected by a transparent passivation film. The color filter layer 150 may also include an array of color filters respectively corresponding to the pixels. The first transparent dielectric layer 120a may be formed by depositing, for example, $SiO_2$ or silanol-based glass.

Figure 3B:
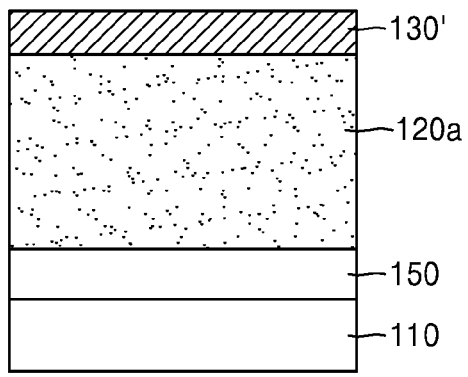

Referring to FIG. 3B, an optical functional layer material 130' may be formed on the first transparent dielectric layer 120a. The optical functional layer material 130' may be a phase change material whose phase varies according to a heat treatment temperature to change a refractive index. For example, the optical functional layer material 130' may be a phase change material such as $TiO_2$ or SiN. A phase change material may have a crystal structure and a refractive index that vary according to a heat treatment temperature. In particular, as a heat treatment temperature increases, a refractive index of a phase change material may increase. That is, a phase change material may have a first refractive index during heat treatment in a first temperature range and may have a second refractive index, which is higher than the first refractive index, during heat treatment in a second temperature range that is higher than the first temperature range. For example, the first temperature range may be from about 400° C. to about 550° C. and the second temperature range may be from about 600° C. to about 900° C. The first refractive index may range from about 2.4 to about 2.6 and the second refractive index may range from about 2.7 to about 2.9. In detail, it is known that $TiO_2$ may have a refractive index of about 2.49 in an amorphous phase, when being heat-treated to about 450° C. through about 550° C., may have a refractive index of about 2.56 in an anatase phase, and when being heat-treated to about 600° C. through about 900° C., may have a refractive index of about 2.87 in a rutile phase. Each refractive index was measured at a wavelength of about 632.8 nm.

In a step of FIG. 3B, the optical functional layer material 130' may be formed in a first temperature range (from about 400° C. to about 550° C.) that is relatively low in order not to damage the light-sensing semiconductor layer 110 and the color filter layer 150 due to heat. For example, the optical functional layer material 130' may be formed on the first transparent dielectric layer 120a by using PVD in the first temperature range. In this case, a refractive index of the optical functional layer material 130' may range from about 2.4 to about 2.6.

Figure 3C:
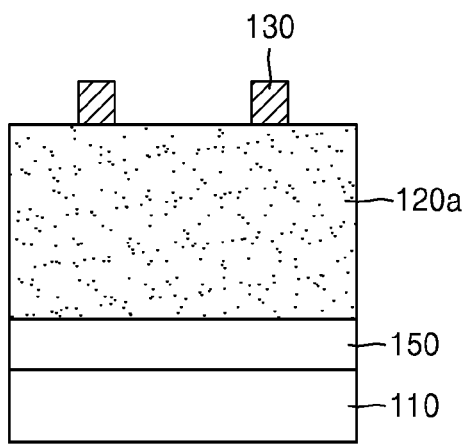

Next, referring to FIG. 3C, the optical functional layer 130 may be formed by patterning the optical functional layer material 130'. Although the optical functional layer 130 has a simple quadrangular shape in FIG. 3C for convenience, the optical functional layer 130 may have any of various other shapes according to a desired optical function. For example, when the optical functional layer 130 is a color separation element in FIG. 1, the optical functional layer material 130' may be patterned such that the optical functional layer 130 has a symmetric or asymmetric bar shape or a prism shape having an inclined surface according to color separation characteristics. Also, when the optical functional layer 130 functions as a lens, the optical functional layer material 130' may be patterned such that the optical functional layer 130 has a convex or concave optical surface.

Figure 3D:
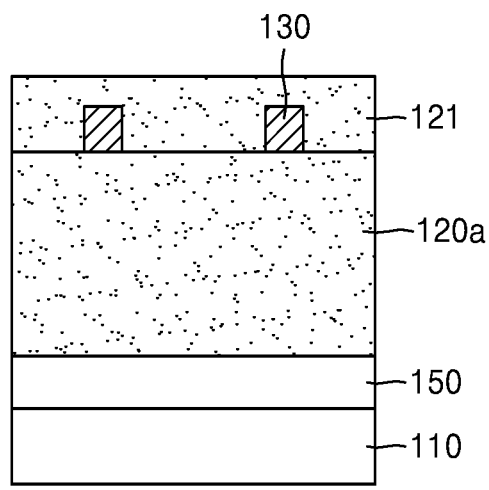

Next, as shown in FIG. 3D, an insulating layer 121 may be formed on the first transparent dielectric layer 120a to completely cover the optical functional layer 130. For example, a height of the insulating layer 121 may be greater than a height of the optical functional layer 130 in order for the insulating layer 121 to completely cover a top surface of the optical functional layer 130. The insulating layer 121 may be formed of $SiO_2$ like the first transparent dielectric layer 120a, but the present exemplary embodiment is not limited thereto. For example, the insulating layer 121 may not need to be transparent, and may be formed of any dielectric material as long as it has heat resistance and insulation in the second temperature range (from about 600° C. to about 900° C.). Also, better performance may be achieved as a material of the insulating layer 121 has lower thermal conductivity.

Figure 3E:
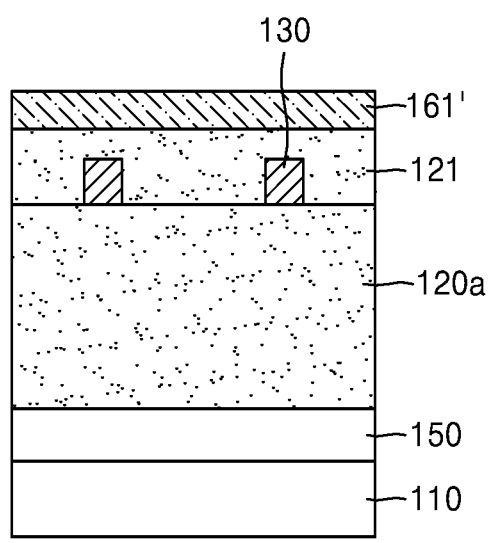

Next, as shown in FIG. 3E, a conductive metal layer material 161' may be formed on the insulating layer 121. For example, the conductive metal layer material 161' may be formed by using sputtering. The conductive metal layer material 161' that is a conductive metal for generating heat when current flows therethrough may include a material that is not melted in the second temperature range (from about 600° C. to about 900° C.). For example, the conductive metal layer material 161' may be a conductive metal material such as copper (Cu), molybdenum (Mo), tungsten (W), gold (Au), or silver (Ag).

Figure 3F:
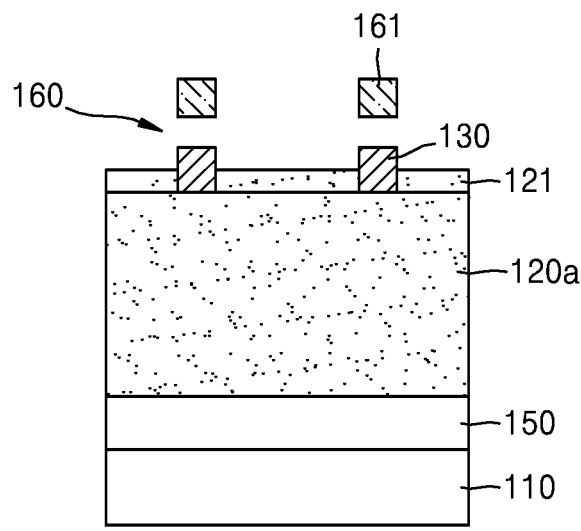

Referring to FIG. 3F, a conductive metal layer 161 may be formed by patterning the conductive metal layer material 161'. During patterning the conductive metal layer material 161', the insulating layer 121 may also be patterned, and a micro-heater 160 including the patterned conductive metal layer 161 and the patterned insulating layer 121 may be formed. To this end, the patterning of the conductive metal layer material 161' may be performed by using, for example, isotropic etching using wet etching. When the conductive metal layer material 161' is patterned by using wet etching, the insulating layer 121 that is disposed under the patterned conductive metal layer 161 may be partially removed to expose an upper portion of the optical functional layer 130. That is, a portion of the insulating layer 121 between the patterned conductive metal layer 161 and the optical functional layer 130 may be removed and thus an empty space may be formed between the patterned conductive metal layer 161 and the optical functional layer 130.

Figure 4:
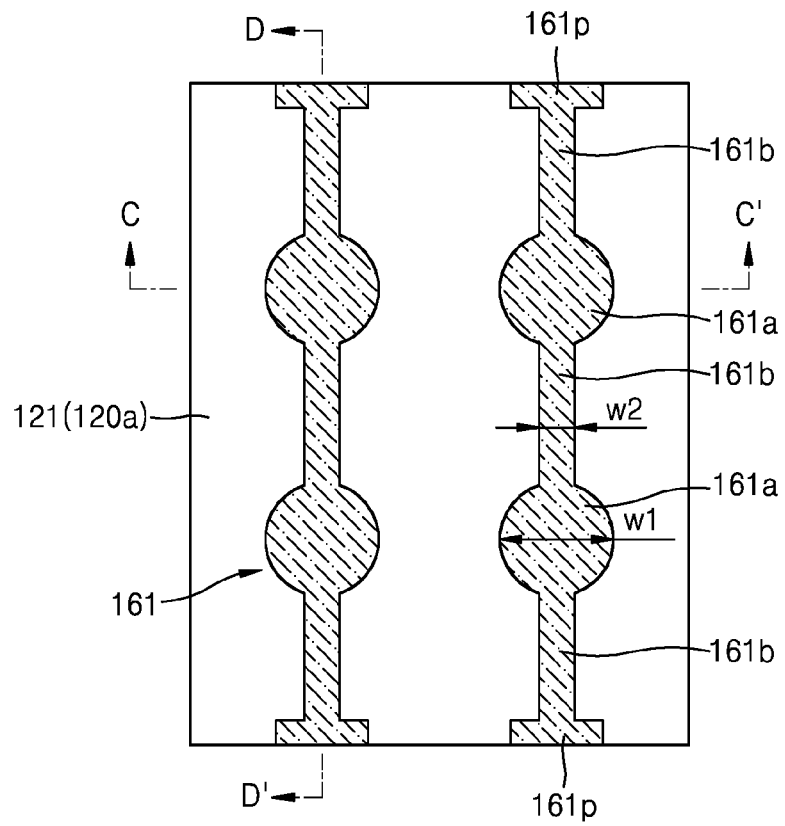
FIG. 4 is a plan view illustrating a pattern of a conductive metal layer of a micro-heater formed in a step of FIG. 3F.

The patterning of the conductive metal layer material 161' may be performed in consideration of subsequent heat treatment of the optical functional layer 130. For example, FIG. 4 is a plan view illustrating a pattern of the conductive metal layer 161 of the micro-heater 160 formed in a step of FIG. 3F. FIG. 3F is a cross-sectional view taken along line C-C' of FIG. 4. Referring to FIG. 4, the patterned conductive metal layer 161 may include a pad portion 161p configured to receive current, a first heating portion 161a configured to generate heat at a temperature lower than or equal to the first temperature range, and a second heating portion 161b configured to generate heat in the second temperature range. As shown in FIG. 4, a width w2 of the second heating portion 161b that generates heat at a relatively high temperature may be less than a width w1 of the first heating portion 161a. Since a resistance increases and a current density increases as a width of the conductive metal layer 161 decreases, a temperature may increase due to Joule heating. A plurality of the second heating portions 161b may be located to correspond to the optical functional layers 130 to be heat-treated. Although two first heating portions 161a and three second heating portions 161b are illustrated in FIG. 4, positions, shapes, and numbers of the first heating portions 161a and the second heating portions 161b are not limited to those in FIG. 4, and may be determined according to positions, shapes, and the number of the optical functional layers 130. For example, when one optical functional layer 130 is formed to have a long linear shape, only one second heating portion 161b may be linearly formed between two pad portions 161p without the first heating portion 161a.

Figure 5:
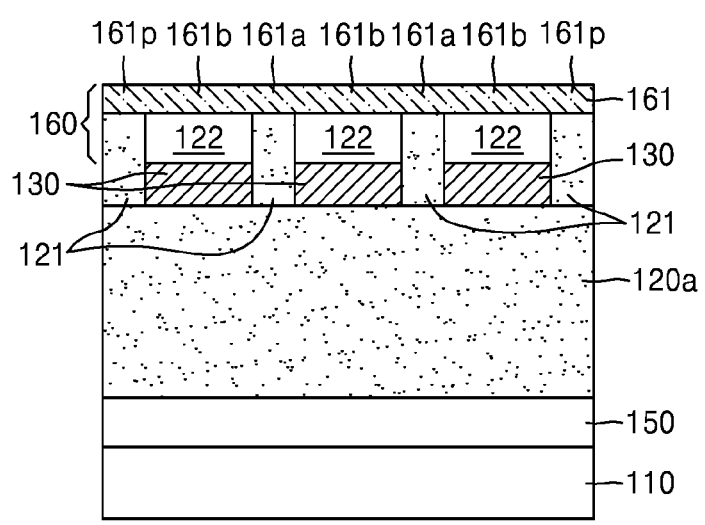
FIG. 5 is a cross-sectional view illustrating a structure of the micro-heater formed in the step of FIG. 3F.

When the conductive metal layer material 161' is etched by using wet etching, a portion of the insulating layer 121 that is disposed under the second heating portion 161b having a small width may be mostly removed to expose an upper portion of the optical functional layer 130 to the outside. In contrast, a portion of the insulating layer 121 that is disposed under the first heating portion 161a having a large width may be slightly removed to form a support portion configured to support the conductive metal layer 161. For example, FIG. 5 is a cross-sectional view illustrating a structure of the micro-heater 160 formed in the step of FIG. 3F, taken along line D-D' of FIG. 4. Referring to FIG. 5, a portion of the insulating layer 121 that is disposed under the second heating portion 161b may be removed to form an empty space 122. Accordingly, a top surface of the optical functional layer 130 may directly face the second heating portion 161b. Portions of the insulating layer 121 that are disposed under the pad portion 161p and the first heating portion 161a may remain to have pillar shapes. Accordingly, the second heating portion 161b may be supported by the portions of the insulating layer 121 remaining under the pad portion 161p and the first heating portion 161a to be suspended over the empty space 122.

Figure 3G:
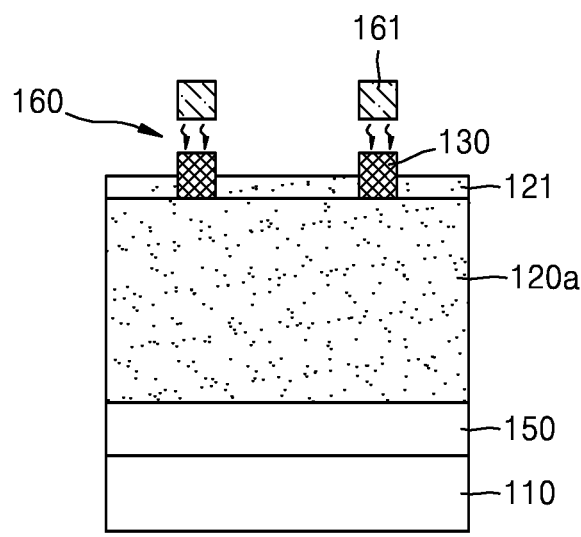

After the micro-heater 160 is formed in the afore-described manner, as shown in FIG. 3G, the optical functional layer 130 may be heat-treated by applying current to the conductive metal layer 161. A temperature at which the optical functional layer 130 is heat-treated may be easily adjusted by using current applied to the conductive metal layer 161. For example, when the optical functional layer 130 is heat-treated in the second temperature range from about 600° C. to about 900° C., the optical functional layer 130 may undergo a phase change and may have a crystal structure having the second refractive index ranging from about 2.7 to about 2.9. Since the top surface of the optical functional layer 130 directly faces the conductive metal layer 161 in the empty space 122, the top surface of the optical functional layer 130 may be easily heated. In contrast, since other layers, for example, the light-sensing semiconductor layer 110 and the color filter layer 150 are shielded from heat due to the first transparent dielectric layer 120a and the insulating layer 121 to some extent, the light-sensing semiconductor layer 110 and the color filter layer 150 may be hardly heated. Accordingly, while the optical functional layer 130 is heated and undergoes a phase change, the light-sensing semiconductor layer 110 and the color filter layer 150 may be hardly affected by heat.

Figure 3H:
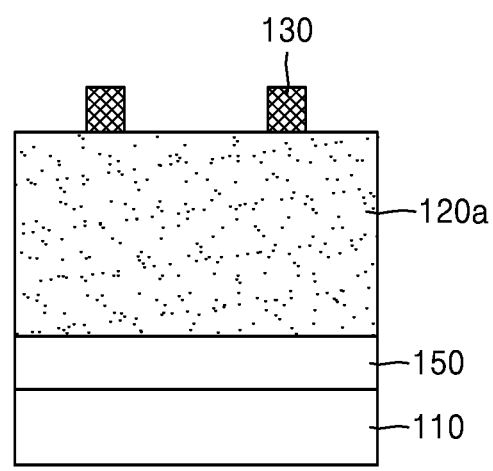

Next, referring to FIG. 3H, the micro-heater 160 disposed on the first transparent dielectric layer 120a, except the optical functional layer 130, may be removed by using etching. For example, the conductive metal layer 161 and the insulating layer 121 may be sequentially removed. However, if the insulating layer 121 and the first transparent dielectric layer 120a are formed of the same material, the insulating layer 121 may remain and only the conductive metal layer 161 may be removed.

Figure 3I:
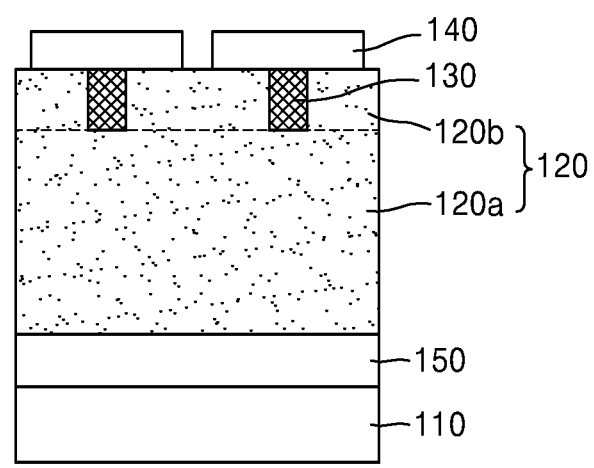

Last, referring to FIG. 3I, a second transparent dielectric layer 120b may be formed on the first transparent dielectric layer 120a to cover the optical functional layer 130. The second transparent dielectric layer 120b may be formed of the same material as that of the first transparent dielectric layer 120a. Accordingly, the first transparent dielectric layer 120a and the second transparent dielectric layer 120b may constitute one transparent dielectric layer 120. Accordingly, the optical functional layer 130 may be buried in the transparent dielectric layer 120. The microlens 140 may be formed on the transparent dielectric layer 120 to face the top surface of each optical functional layer 130, thereby completing the image sensor.

In the exemplary embodiment of FIGS. 3A through 3I, the optical functional layer 130 is first patterned and then is heat-treated. However, the optical functional layer 130 may be first heat-treated and then may be patterned. For example, FIGS. 6A through 6E are cross-sectional views for explaining a process of manufacturing the image sensor of FIG. 1 according to another exemplary embodiment.

Figure 6A:
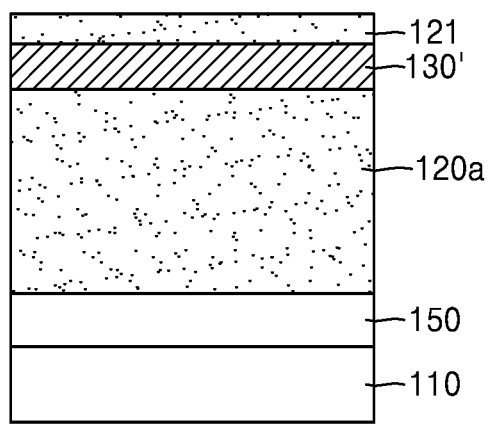
FIGS. 6A, 6B, 6C, 6D, and 6E are cross-sectional views for explaining a process of manufacturing the image sensor of FIG. 1, according to another exemplary embodiment.

First, referring to FIG. 6A, the color filter layer 150 is formed on the light-sensing semiconductor layer 110 and the first transparent dielectric layer 120a is formed on the color filter layer 150 by using the step of FIGS. 3A and 3B. The optical functional layer material 130' may be formed on the first transparent dielectric layer 120a, and then the insulating layer 121 may be formed on the optical functional layer material 130' to have a constant thickness. As described with reference to FIG. 3B, in a step of FIG. 6A, the optical functional layer material 130' may be formed in the first temperature range (from about 400° C. to about 550° C.) that is relatively low in order not to damage the light-sensing semiconductor layer 110 and the color filter layer 150 due to heat. For example, the optical functional layer material 130' may be formed on the first transparent dielectric layer 120a by using PVD in the first temperature range. In this case, a refractive index of the optical functional layer material 130' may range from about 2.4 to about 2.6.

Figure 6B:
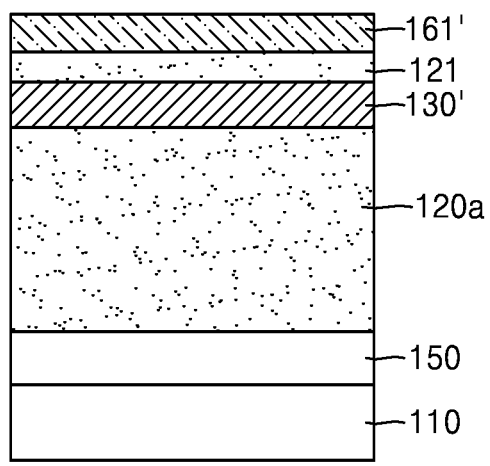
Figure 6C:
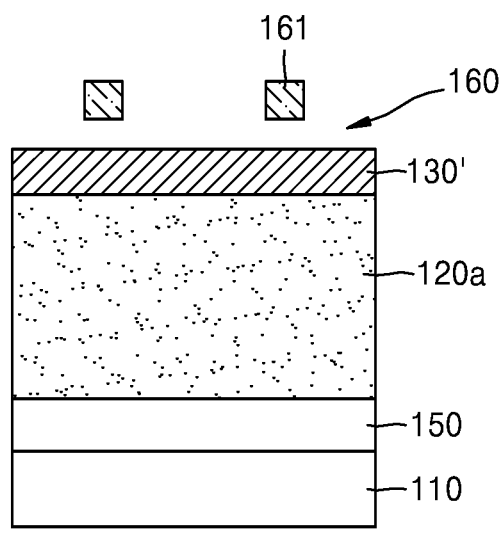

Next, referring to FIG. 6B, the conductive metal layer material 161' may be formed on the insulating layer 121. Materials of the insulating layer 121 and the conductive metal layer material 161' are the same as those described with reference to FIGS. 3D and 3E. Next, as shown in FIG. 6C, the conductive metal layer 161 may be formed by patterning the conductive metal layer material 161'. As described above, when the conductive metal layer material 161' is patterned by using wet etching, the insulating layer 121 may also be patterned to form the micro-heater 160 including the patterned conductive metal layer 161 and the patterned insulating layer 121. Accordingly, a top surface of the optical functional layer material 130' disposed under the insulating layer 121 may be exposed to the outside. The exposed top surface of the optical functional layer material 130' directly faces the conductive metal layer 161 in an empty space.

As described with reference to FIG. 4, the patterning of the conductive metal layer material 161' may be performed in consideration of subsequent heat treatment of the optical functional layer 130. The conductive metal layer 161 that is patterned in a step of FIG. 6C may also include the first heating portion 161a configured to generate heat at a temperature or lower than or equal to the first temperature range and the second heating portion 161b configured to generate heat in the second temperature range. Positions, shapes, and numbers of the first heating portion 161a and the second heating portion 161b may be determined according to positions, shapes, and the number of the optical functional layers 130 to be formed in a subsequent process.

Figure 7:
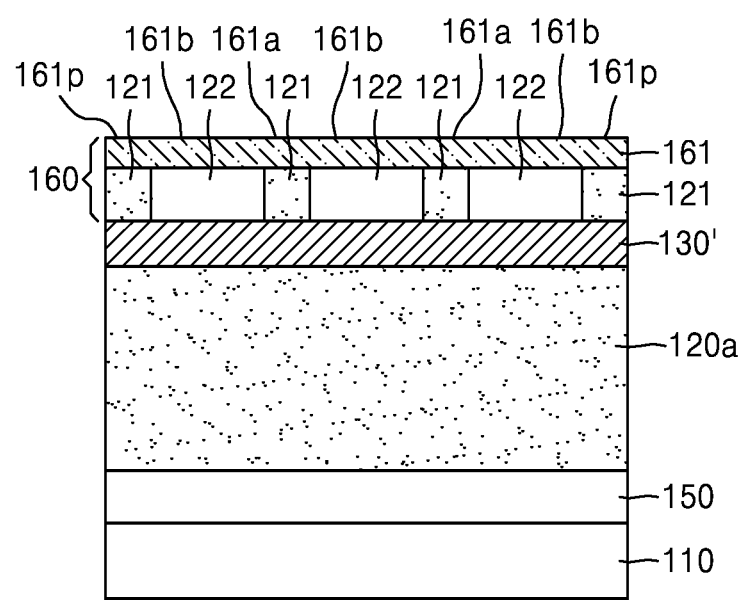
FIG. 7 is a cross-sectional view illustrating a structure of the micro-heater formed in a step of FIG. 6C.

FIG. 7 is a cross-sectional view illustrating a structure of the micro-heater 160 formed in the step of FIG. 6C, seen in the same direction as that in FIG. 5. Referring to FIG. 7, the optical functional layer material 130' is disposed on the first transparent dielectric layer 120a to have a constant thickness. The patterned insulating layer 121 is disposed on the optical functional layer material 130'. Portions of the insulating layer 121 that are disposed under the pad portion 161p and the first heating portion 161a remain and a portion of the insulating layer 121 that is disposed under the second heating portion 161b is mostly removed to form an empty space 122. Accordingly, the second heating portion 161b may be supported by the portions of the insulating layer 121 remaining under the first heating portion 161a and the pad portion 161p to be suspended over the empty space 122. Also, as shown in FIG. 7, only a portion of the top surface of the optical functional layer material 130 directly faces the second heating portion 161b of the conductive metal layer 161 in the empty space 122.

Figure 6D:
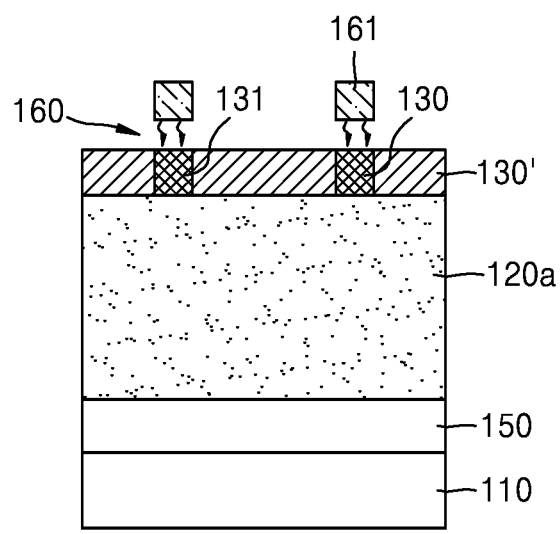
Figure 8:
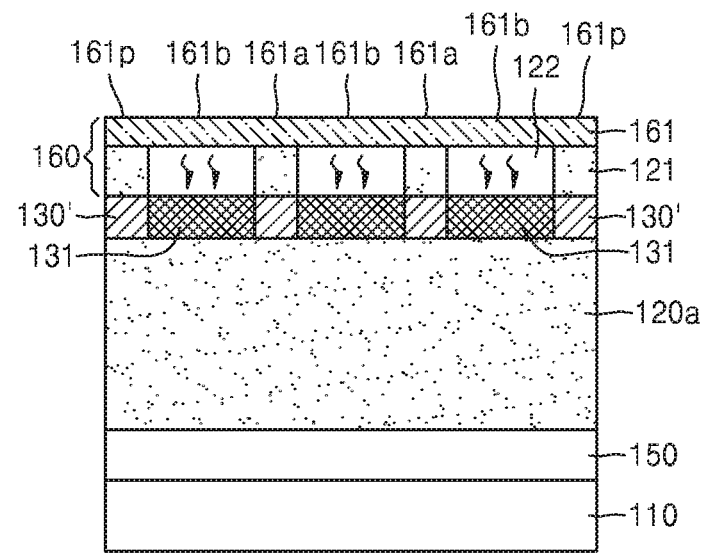
FIG. 8 is a cross-sectional view for explaining a process of locally heat-treating an optical functional layer material in FIG. 6D.

After the micro-heater 160 is formed in this manner, as shown in FIG. 6D, the optical functional layer material 130' may be locally heat-treated by applying current to the conductive metal layer 161. Also, FIG. 8 is a cross-sectional view for explaining a process of locally heat-treating the optical functional layer material 130' in FIG. 6D, seen in the same direction as that of FIG. 7. Referring to FIGS. 6D and 7, a portion of the optical functional layer material 130' that directly faces the second heating portion 161b of the conductive metal layer 161 in the empty space 122 may be heated, for example, in the second temperature range from about 600° C. to about 900° C. Portions of the optical functional layer material 130' that face the pad portion 161p and the first heating portion 161a with the insulating layer 121 therebetween may be heated, for example, at a temperature equal to or lower than the first temperature range. Also, a portion of the optical functional layer material 130' that does not face the conductive metal layer 161 may not be heated.

A temperature at which the second heating portion 161b generates heat may be adjusted by using current applied to the conductive metal layer 161. When the second heating portion 161b generates heat in the second temperature range from about 600° C. to about 900° C., the portion of the optical functional layer material 130' that directly faces the second heating portion 161b of the conductive metal layer 161 in the empty space 122 may undergo a phase change and thus the optical functional layer 130 having a crystal structure having the second refractive index ranging from about 2.7 to about 2.9 may be obtained. Since the other portions of the optical functional layer material 130', that is, the portions that face the pad portion 161p and the first heating portion 161a and the portion that does not face the conductive metal layer 161, do not undergo a phase change, the other portions of the optical functional layer material 130' may continuously have the first refractive index ranging from about 2.4 to about 2.6. In this manner, the optical functional layer 130 having the second refractive index ranging about 2.7 to about 2.9 may be formed by enabling only a portion of the optical functional layer material 130' to undergo a phase change.

Figure 6E:
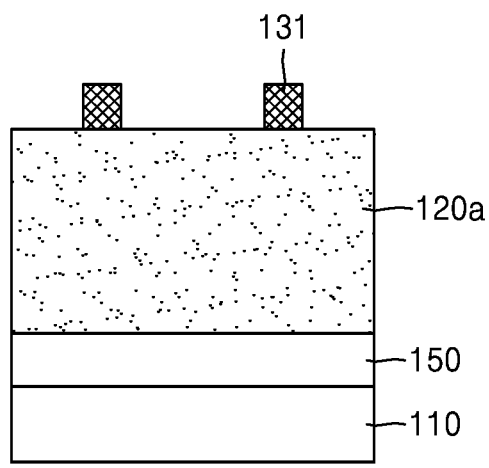

Next, referring to FIG. 6E, the micro-heater 160 may be removed by using etching. For example, the optical functional layer material 130', and the conductive metal layer 161 and the insulating layer 121 disposed on the optical functional layer 130 may be sequentially removed. Except the optical functional layer 130 having the second refractive index, the optical functional layer material 130' having the first refractive index may be selectively removed. For example, when TiO$_2$ is used as the optical functional layer material 130', only a portion in a rutile phase may remain and a portion in an anatase phase may be removed by using 10% hydrofluoric acid (HF).

After the optical functional layer 130 is formed in this manner, as described with reference to FIG. 3I, the second transparent dielectric layer 120b may be formed on the first transparent dielectric layer 120a to cover the optical functional layer 130. Accordingly, the optical functional layer 130 may be buried in the transparent dielectric layer 120. The microlens 140 may be formed on the transparent dielectric layer 120 to face the top surface of each optical functional layer 130, thereby completing the image sensor.

As described above, according to the present exemplary embodiment, the optical functional layer 130 having a high refractive index may be formed without depositing the optical functional layer 130 at a high temperature. That is, after the optical functional layer 130 may be deposited at a relatively low temperature, only the optical functional layer 130 may be selectively or locally heated by using the micro-heater 160 to increase a refractive index of the optical functional layer 130. Accordingly, the image sensor having a high refractive index may be manufactured without restrictions of or during a high-temperature process. Since a refractive index of the optical functional layer 130 is high, a thickness of the image sensor may be reduced.

Although the plurality of first and second optical functional layers 131 and 132 that function as color separation elements are separately arranged in pixels in FIG. 1, one optical functional layer may be linearly disposed over a plurality of pixels. For example, FIGS. 9 and 10 are plan views illustrating pixel structures of the image sensor according to other exemplary embodiments.

Figure 9:
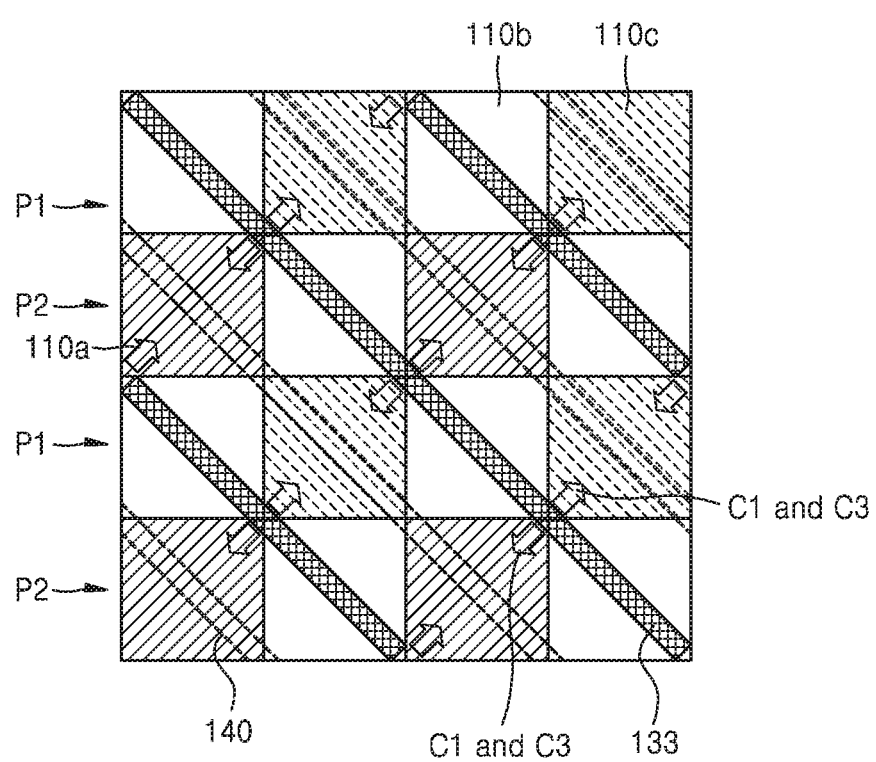
FIG. 9 is a plan view illustrating a pixel structure of the image sensor according to another exemplary embodiment.

Referring to FIG. 9, the image sensor may include a third optical functional layer 133 that is diagonally disposed. For example, when it is assumed that the first pixel 110*a* and the third pixel 110*c* are arranged in a first diagonal direction and the second pixels 110*b* are arranged in a second diagonal direction that intersects the first diagonal direction, the third optical functional layer 133 may be disposed to face the plurality of second pixels 110*b* in the second diagonal direction. The third optical functional layer 133 may be configured such that the light C2 having the second wavelength band travels downward from the third optical functional layer 133 and the lights C1 and C3 having remaining wavelength bands travel in the first diagonal direction. The image sensor may further include a plurality of the microlenses 140 that are disposed in the second diagonal direction along the third optical functional layer 133 as marked by a dashed line in FIG. 9. In the image sensor of FIG. 9, as marked by arrows, the first pixel 110*a* and the third pixel 110*c* may respectively receive the lights C1 and C3 having the first and third wavelength bands in the first diagonal direction.

Figure 10:
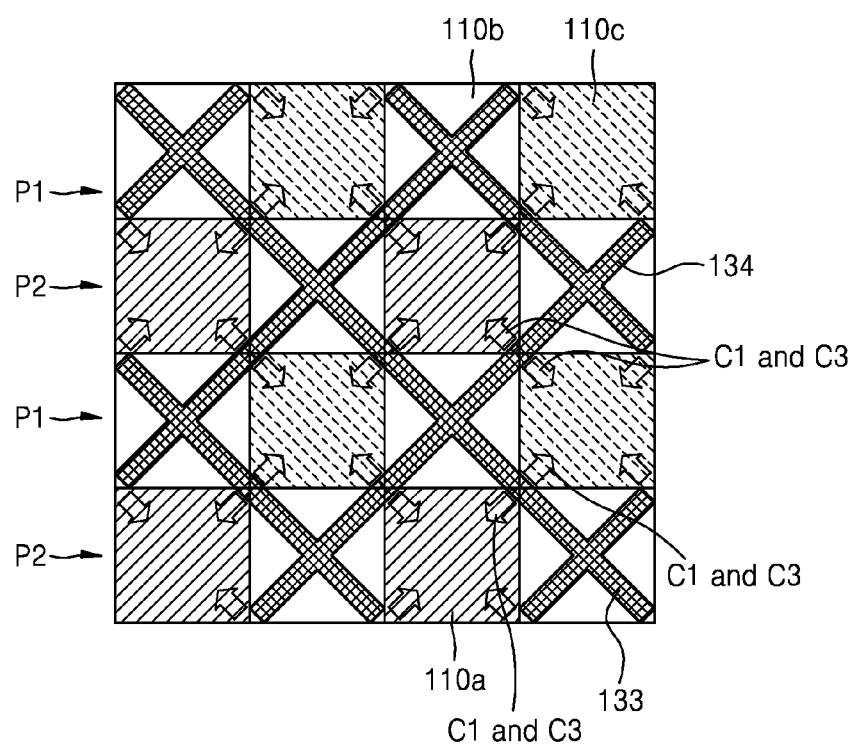
FIG. 10 is a plan view illustrating a pixel structure of the image sensor according to another exemplary embodiment.

Also, referring to FIG. 10, the image sensor may include the third optical functional layer 133 disposed to face the plurality of second pixels 110*b* in the second diagonal direction and a fourth optical functional layer 134 disposed to face the plurality of second pixels 110*b* in the first diagonal direction. The third optical functional layer 133 may be configured such that the light C2 having the second wavelength band travels downward from the third optical functional layer 133 and the lights C1 and C3 having the remaining wavelength bands travel in the first diagonal direction, and the fourth optical functional layer 134 may be configured such that the light C2 having the second wavelength band travels downward from the fourth optical functional layer 134 and the lights C1 and C3 having the remaining wavelength bands travel in the second diagonal direction. In this regard, the fourth optical functional layer 134 has the same color separation characteristics as those of the third optical functional layer 133 and may be obtained by rotating the third optical functional layer 133 by 90°. In the image sensor of FIG. 10, as marked by arrows, the first pixel 110*a* and the third pixel 110*c* may respectively receive the lights C1 and C3 having the first and third wavelength bands in the first and second diagonal directions.

The above has been described on the assumption that the optical functional layers 130, 131, 132, 133, and 134 are color separation elements and the optical apparatus is an image sensor. However, the exemplary embodiments of FIGS. 3A through 3I and FIGS. 6A through 6E may be applied to any optical apparatus using both a semiconductor layer and a material having a high refractive index, and an optical functional layer having a high refractive index may function as an optical element other than a color separation element. For example, the microlens 140 of FIGS. 2A and 2B may also be formed by using the method of FIGS. 3A through 3I or FIGS. 6A through 6E, and in this case, the microlens 140 may be an optical functional layer having a high refractive index. When the microlens 140 is formed of a material having a high refractive index, a refractive index of the microlens 140 may be increased.

Also, the optical apparatus may be a light-emitting diode (LED) or an organic light-emitting diode (OLED), instead of an image sensor, and the optical functional layer may be a light-extracting structure of an LED or an OLED.

Figure 11:
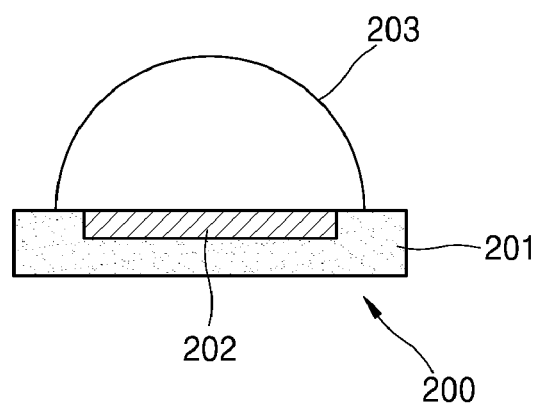
FIG. 11 is a cross-sectional view illustrating a structure of a light-emitting diode (LED) according to an exemplary embodiment.

For example, FIG. 11 is a cross-sectional view illustrating a structure of an LED 200 according to an exemplary embodiment. Referring to FIG. 11, the LED 200 may include an LED chip 202 disposed on a substrate 201 and an encapsulation member 203 disposed on the substrate 201 to surround the LED chip 202. The LED chip 202 may be generally formed by using a compound semiconductor such as GaN. When a difference between a refractive index of the encapsulation member 203 and a refractive index of GaN increases, light loss occurs on an interface between the encapsulation member 203 and the LED chip 202, thereby reducing light-extracting efficiency of the encapsulation member 203. Accordingly, the encapsulation member 203 may be formed to have a high refractive index by using the method of FIGS. 3A through 3I or FIGS. 6A through 6E. In this case, the encapsulation member 203 may be an optical functional layer.

Figure 12:
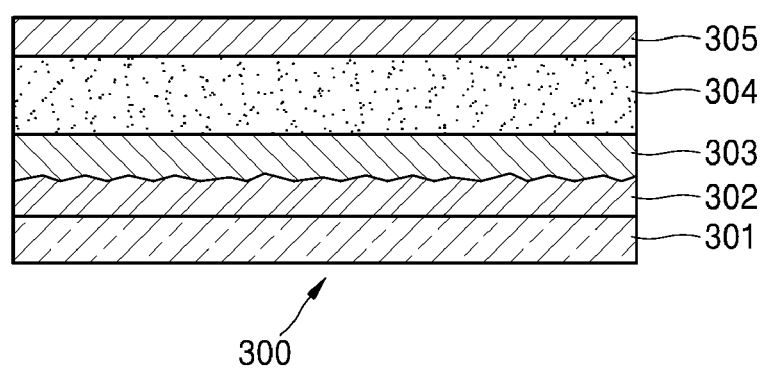
FIG. 12 is a cross-sectional view illustrating a structure of an organic light-emitting diode (OLED) according to an exemplary embodiment.

FIG. 12 is a cross-sectional view illustrating a structure of an OLED 300 according to an exemplary embodiment. Referring to FIG. 12, the OLED 300 may include a transparent substrate 301, a light-extracting layer 302 disposed on the transparent substrate 301, a transparent electrode 303 disposed on the light-extracting layer 302, a light-emitting layer 304 disposed on the transparent electrode 303, and a reflective electrode 305 disposed on the light-emitting layer 304. The transparent electrode 303 may be formed of a transparent conductive oxide such as indium tin oxide (ITO) or indium zinc oxide (IZO). The light-extracting layer 302 discharges light generated by the light-emitting layer 304 to the outside through the transparent substrate 301. To this end, the light-extracting layer 302 may be formed of a material having a refractive index that is higher than a refractive index of the light-emitting layer 304. Also, the reflective electrode 305 may be formed of a conductive metal material having a high reflectivity such as gold (Au), silver (Ag), or aluminum (Al). The light-emitting layer 304 may be formed of, for example, an organic light-emitting material.

In the structure of the OLED 300, in order to improve light extracting efficiency of the light-extracting layer 302, an uneven structure may be formed on an interface between the light-extracting layer 302 and the transparent electrode 303. As a surface roughness of an uneven portion of the light-extracting layer 302 increases, scattering efficiency of the light-extracting layer 302 may increase whereas processability may deteriorate. Accordingly, when a material having a high refractive index is used for the light-extracting layer 302 by using the method of FIGS. 3A through 3I or FIGS. 6A through E, a surface roughness of the uneven portion of the light-extracting layer 302 may be reduced. In this case, the light-extracting layer 302 may be an optical functional layer.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An optical apparatus comprising:
a semiconductor layer; and
an optical functional layer comprising a phase change material that has a first refractive index during heat treatment in a first temperature range and has a second refractive index, which is higher than the first refractive index, during heat treatment in a second temperature range that is higher than the first temperature range,
wherein the phase change material of the optical functional layer having the second refractive index is disposed on the semiconductor layer.

2. The optical apparatus of claim 1, wherein the phase change material comprises $TiO_2$.

3. The optical apparatus of claim 1, wherein the first temperature range is from about 400° C. to about 550° C. and the second temperature range is from about 600° C. to about 900° C.

4. The optical apparatus of claim 1, wherein the first refractive index ranges from about 2.4 to about 2.6 and the second refractive index ranges from about 2.7 to about 2.9.

5. The optical apparatus of claim 1, wherein the optical apparatus is an image sensor, and the semiconductor layer comprises a pixel array of a plurality of pixels that detects an intensity of incident light.

6. The optical apparatus of claim 5, wherein the optical functional layer comprises a plurality of color separation elements, and
wherein each of the plurality of color separation elements splits the incident light according to wavelengths such that light having a first wavelength among the incident light is emitted in a first direction and light having a second wavelength, which is different from the first wavelength, among the incident light is emitted in a second direction that is different from the first direction.

7. The optical apparatus of claim 6, wherein the pixel array comprises a plurality of first pixels provided to detect the light having the first wavelength and a plurality of second pixels provided to detect the light having the second wavelength that is different from the first wavelength,
wherein the plurality of first pixels and the plurality of second pixels are alternately arranged,
wherein the plurality of color separation elements are configured such that the light having the first wavelength among the incident light travels to the plurality of first pixels and the light having the second wavelength among the incident light travels to the plurality of second pixels.

8. The optical apparatus of claim 5, wherein the optical functional layer comprises a plurality of microlenses configured to focus the incident light on the plurality of pixels.

9. An image sensor comprising:
a pixel array comprising a plurality of light-sensing pixels provided to detect an intensity of incident light; and
a plurality of color separation elements facing the pixel array and configured to split the incident light into a plurality of sub-lights according to wavelengths and enable the plurality of sub-lights to travel in different directions,
wherein the plurality of color separation elements comprises a phase change material that has a first refractive index during heat treatment in a first temperature range and has a second refractive index, which is higher than the first refractive index, during heat treatment in a second temperature range that is higher than the first temperature range,
wherein the plurality of color separation elements has the second refractive index.

10. The image sensor of claim 9, wherein the pixel array comprises a plurality of first pixels provided to detect light having a first wavelength and a plurality of second pixels provided to detect light having a second wavelength that is different from the first wavelength,
wherein the plurality of first pixels and the plurality of second pixels are alternately arranged.

11. The image sensor of claim 9, wherein each of the plurality of color separation elements is configured such that light having a first wavelength among the incident light travels to a first pixel and light having a second wavelength among the incident light travels to a second pixel.

12. The image sensor of claim 9, wherein the pixel array comprises a first pixel and a third pixel arranged in a first diagonal direction and two second pixels arranged in a second diagonal direction that intersects the first diagonal direction, and is configured such that the first pixel detects light having a first wavelength, the two second pixels detect light having a second wavelength, and the third pixel detects light having a third wavelength.

13. The image sensor of claim 9, further comprising a color filter layer disposed on the pixel array,
wherein the color filter layer comprises a first color filter configured to transmit light having a first wavelength, a second color filter configured to transmit light having a second wavelength, and a third color filter configured to transmit light having a third wavelength.

14. The image sensor of claim 9, wherein the phase change material comprises $TiO_2$.

15. The image sensor of claim 9, wherein the first temperature range is from about 400° C. to about 550° C. and the second temperature range is from about 600° C. to about 900° C.

16. The image sensor of claim 9, wherein the first refractive index ranges from about 2.4 to about 2.6 and the second refractive index ranges from about 2.7 to about 2.9.

17. An image sensor comprising:
a. pixel array comprising a plurality of light-sensing pixels provided to detect an intensity of incident light; and
a plurality of color separation elements facing the pixel array and configured to split the incident light into a plurality of sub-lights according to wavelengths and enable the plurality of sub-lights to travel in different directions,
wherein the plurality of color separation elements comprises a phase change material that has a first refractive index during heat treatment in a first temperature range and has a second refractive index, which is higher than the first refractive, index, during heat treatment in a second temperature range that is higher than the first temperature range, wherein the plurality of color separation elements has the second refractive index, wherein the pixel array comprises a first pixel and a third pixel arranged in a first diagonal direction and two second pixels arranged in a second diagonal direction that intersects the first diagonal direction, and is configured such that the first pixel detects light having a first wavelength, the two second pixels detect light having a second wavelength, and the third pixel detects light having a third wavelength, wherein the plurality of color separation elements comprises a first color separation element arranged in the first diagonal direction and a second color separation element arranged in the second diagonal direction, and wherein the first and second color separation elements are configured such that the light having the first wavelength among the incident light travels to the first pixel and the light having the second and third wavelengths among the incident light travels to the third pixel.

18. A method of manufacturing an optical apparatus, the method comprising:

depositing an optical functional layer material in a first temperature range;

forming a micro-heater on the optical functional layer material;

locally heat-treating the optical functional layer material in a second temperature range, which is higher than the first temperature range, by applying current to the micro-heater; and removing the micro-heater, wherein the optical functional layer material comprises a phase change material that has a first refractive index during heat treatment in the first temperature range and has a second refractive index, which is higher than the first refractive index, during heat treatment in the second temperature range that is higher than the first temperature range.

19. The method of claim 18, wherein the phase change material comprises $TiO_2$ or SiN.

20. The method of claim 18, wherein the first temperature range is from about 400° C. to about 550° C. and the second temperature range is from about 600° C. to about 900° C.

21. The method of claim 18, wherein the first refractive index ranges from about 2.4 to about 2.6 and the second refractive index ranges from about 2.7 to about 2.9.

22. The method of claim 18, wherein the forming of the micro-heater comprises:

forming an insulating layer on the optical functional layer material;

forming a conductive metal layer material on the insulating layer; and forming a conductive metal layer by patterning the conductive metal layer material by using wet etching, wherein a portion of the insulating layer that is disposed under the conductive metal layer is removed during the patterning of the conductive metal layer material to expose the optical functional layer material to the patterned conductive metal layer.

23. The method of claim 22, wherein the patterned conductive metal layer comprises a pad portion configured to receive current, a first heating portion configured to generate heat at a temperature lower than or equal to the first temperature range, and a second heating portion configured to generate heat in the second temperature range, wherein a width of the second heating portion is less than a width of the first heating portion, and wherein a portion of the insulating layer that is disposed under the pad portion or the first heating portion of the patterned conductive metal layer remains without being removed.

24. The method of claim 18, wherein the depositing of the optical functional layer material further comprises patterning the deposited optical functional layer material to form an optical functional layer.

25. The method of claim 18, wherein the local heat-treating of the optical functional layer material further comprising removing portions of the optical functional layer material other than a portion of the optical functional layer material that is heat-treated in the second temperature range, to form an optical functional layer.

* * * * *